US010791633B2

(12) United States Patent
Ito et al.

(10) Patent No.: US 10,791,633 B2
(45) Date of Patent: Sep. 29, 2020

(54) THICK CONDUCTOR BUILT-IN TYPE PRINTED WIRING BOARD AND METHOD FOR PRODUCING SAME

(71) Applicant: Panasonic Intellectual Property Management Co., Ltd., Osaka (JP)

(72) Inventors: Akira Ito, Osaka (JP); Eiichiro Saito, Osaka (JP); Naohito Fukuya, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/471,831

(22) PCT Filed: Dec. 18, 2017

(86) PCT No.: PCT/JP2017/045238
§ 371 (c)(1),
(2) Date: Jun. 20, 2019

(87) PCT Pub. No.: WO2018/131390
PCT Pub. Date: Jul. 19, 2018

(65) Prior Publication Data
US 2020/0100370 A1 Mar. 26, 2020

(30) Foreign Application Priority Data
Jan. 13, 2017 (JP) .................................. 2017-004707

(51) Int. Cl.
*H05K 3/46* (2006.01)
*H05K 1/03* (2006.01)
(Continued)

(52) U.S. Cl.
CPC ........... *H05K 3/4644* (2013.01); *B32B 7/027* (2019.01); *H05K 1/0298* (2013.01); *H05K 1/0366* (2013.01)

(58) Field of Classification Search
CPC ........................... H05K 1/0366; H05K 3/4644
See application file for complete search history.

(56) References Cited
U.S. PATENT DOCUMENTS

2002/0044429 A1* 4/2002 Boucheron ............. B60R 16/02
361/752
2010/0003475 A1* 1/2010 Yamaguchi ............. C22C 13/00
428/209
(Continued)

FOREIGN PATENT DOCUMENTS
JP 8-298378 11/1996
JP 2007-288022 11/2007
(Continued)

OTHER PUBLICATIONS
International Search Report of PCT application No. PCT/JP2017/045238 dated Mar. 20, 2018.

*Primary Examiner* — Jeremy C Norris
(74) *Attorney, Agent, or Firm* — McDermott Will & Emery LLP

(57) ABSTRACT

A thick conductor built-in type printed wiring board includes a printed wiring board, an insulating resin layer, an insulating base material layer, and a conductor layer. The printed wiring board includes an insulating layer including a cured product of a first resin composition, and a circuit provided on one main surface or both main surfaces of the insulating layer, the circuit having a plurality of conductor wirings each having a thickness ranging from 105 μm to 630 μm, inclusive. The insulating resin layer covers a surface of the printed wiring board on which the circuit is provided, and includes a cured product of a second resin composition and includes no fibrous base material. The insulating base material layer covers the insulating resin layer, and includes a cured product of a third resin composition and a fibrous base material. The conductor layer covers the insulating base (Continued)

material layer. The thick conductor built-in type printed wiring board does not include a void having a diameter of more than or equal to 10 μm inside the thick conductor built-in type printed wiring board.

6 Claims, 2 Drawing Sheets

(51) Int. Cl.
  *B32B 7/027* (2019.01)
  *H05K 1/02* (2006.01)

(56) References Cited

U.S. PATENT DOCUMENTS

2015/0041184 A1* 2/2015 Nam .................... H05K 3/4602
  174/251
2015/0179560 A1* 6/2015 Arisaka ................ H05K 1/0366
  257/777

FOREIGN PATENT DOCUMENTS

| JP | 2009-021469 | 1/2009 |
| JP | 2010-056176 | 3/2010 |

* cited by examiner

THICK CONDUCTOR BUILT-IN TYPE PRINTED WIRING BOARD AND METHOD FOR PRODUCING SAME

TECHNICAL FIELD

The present disclosure relates to a thick conductor built-in type printed wiring board and a method for producing the same.

BACKGROUND

In an electronic circuit board, a thick conductor having a thickness exceeding 100 μm is useful because current capacity is high and heat is readily radiated. However, a multilayer electronic circuit board using such a thick conductor has not been used so much because the thick conductor is difficult to be embedded.

Unexamined Japanese Patent Publication No. 2009-021469 discloses a heat conductive printed wiring board composed of a printed wiring board, a first composite layer formed on one or more surfaces of the printed wiring board, a second composite layer formed on the first composite layer, a surface layer wiring pattern formed on the second composite layer, and a blind via. The printed wiring board is formed by laminating a glass epoxy resin and a thick copper foil having a thickness ranging from 30 microns to 120 microns, inclusive, in which a wiring pattern is formed. The first composite layer has a thickness thicker than that of the thick copper foil, and is made of a resin and an inorganic filler. And the first composite layer has a thermal conduction rate within a predetermined range. The second composite layer is formed of a resin and an inorganic filler, and has a thermal conduction rate within a predetermined range. The blind via connects the thick copper foil and the surface layer wiring pattern via holes formed on the first composite layer and the second composite layer.

Unexamined Japanese Patent Publication No. 8-298378 discloses a multilayer printed wiring board obtained by overlapping a predetermined number of prepregs on upper and lower surfaces of an inner layer circuit board in which an inner layer circuit pattern having a thickness of 70 μm is formed on its front and back surfaces, overlapping a metal foil on the both surfaces thereof, and subjecting them to heat-compression-molding.

SUMMARY

A thick conductor built-in type printed wiring board according to a first aspect of the present disclosure includes a printed wiring board, an insulating resin layer, an insulating base material layer, and a conductor layer. The printed wiring board includes an insulating layer and a circuit provided on one main surface or both main surfaces of the insulating layer. The insulating layer includes a cured product of a first resin composition. The circuit includes a plurality of conductor wirings each having a thickness of ranging from 105 μm to 630 μm, inclusive. The insulating resin layer covers a surface of the printed wiring board on which the circuit is provided, and includes a cured product of a second resin composition and no fibrous base material. The insulating base material layer covers the insulating resin layer, and includes a cured product of a third resin composition and a fibrous base material. The conductor layer covers the insulating base material layer. The thick conductor built-in type printed wiring board does not include a void having a diameter of more than or equal to 10 μm inside the thick conductor built-in type printed wiring board.

A method for producing a thick conductor built-in type printed wiring board according to a second aspect of the present disclosure includes following steps (A) to (C). In step (A), a printed wiring board that has an insulating layer including a cured product of a first resin composition is prepared. And a circuit is provided on one main surface or both main surfaces of the insulating layer. The circuit includes a plurality of conductor wirings each having a thickness ranging from 105 μm to 630 μm, inclusive. In step (B), a laminated body is formed by overlapping a resin layer, a prepreg, and a conductor layer in this order on a surface of the printed wiring board on which the circuit is provided, the resin layer including an uncured product of a second resin composition and no fibrous base material. The prepreg includes a fibrous base material and an uncured product of a third resin composition impregnated in the fibrous base material. In step (C), the laminated body is heated and compressed between hot plates to be integrally laminated.

The present disclosure makes it possible to keep excellent electrical insulation properties even when an electronic component is mounted by reflow soldering.

DESCRIPTION OF EMBODIMENT

Before describing an exemplary embodiment of the present disclosure, problems in conventional techniques will be briefly described. As described in Unexamined Japanese Patent Publication No. 2009-021469, a heat conductive printed wiring board in which a thick copper foil is embedded with a first composite layer does not include a base material such as glass cloth unlike a prepreg. Accordingly, a distance between the thick copper foil and a surface layer wiring pattern cannot be sufficiently secured, which can cause insulation failure.

As described in Unexamined Japanese Patent Publication No. 8-2983784, in a multilayer printed wiring board in which an inner layer circuit pattern is embedded only with a cured product of prepreg, the inner circuit pattern may not be sufficiently embedded when a thickness of the inner layer circuit pattern is more or equal to 105 μm. Accordingly, a void (micro void) readily remains between adjacent inner circuit patterns. Furthermore, lack of uniformity in a thickness of the multilayer printed wiring board is likely to be generated. Furthermore, cloth touch, which is that glass cloth of a prepreg and the inner layer circuit pattern are in contact with each other, is likely to occur. When an electronic component is implemented, by reflow soldering, on the multilayer printed wiring board in which close touch is generated, a crack is formed in the cured product of prepreg. Thus, insulation reliability between inner layer circuit patterns, and between the inner layer circuit pattern and a metal foil are disadvantageously lowered.

Therefore, the present disclosure provides a thick conductor built-in type printed wiring board that keeps excellent electrical insulation properties even when an electronic component is mounted thereon by reflow soldering, and a method for producing the same.

Hereinafter, the exemplary embodiment of the present disclosure will be described.

[Thick Conductor Built-in Type Printed Wiring Board]

Figure 1:
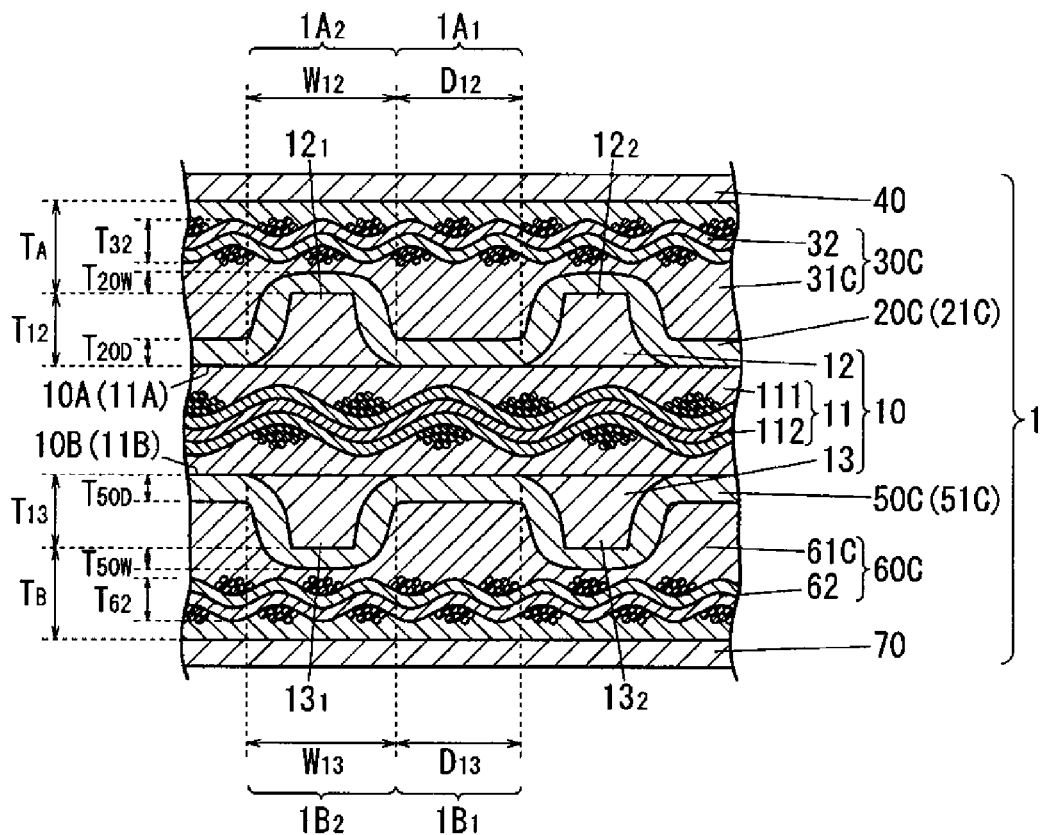
FIG. 1 is a schematic cross-sectional view illustrating a thick conductor built-in type printed wiring board in its thickness direction according to an exemplary embodiment of the present disclosure.

FIG. 1 is a cross-sectional view illustrating thick conductor built-in type printed wiring board 1 in its thickness direction according to the exemplary embodiment. As illustrated in FIG. 1, thick conductor built-in type printed wiring board 1 according to the exemplary embodiment includes printed wiring board 10, first insulating resin layer 20C, first insulating base material layer 30C, first conductor layer 40, second insulating resin layer 50C, second insulating base material layer 60C, and second conductor layer 70.

Printed wiring board 10 includes insulating layer 11, first circuit 12, and second circuit 13. First circuit 12 is disposed on first surface 11A of insulating layer 11 as illustrated in FIG. 1. Second circuit 13 is disposed on second surface 11B of insulating layer 11 as illustrated in FIG. 1. Insulating layer 11 includes cured product 111 of a first resin composition. First circuit 12 includes a plurality of first conductor wirings $12_1$ to $12_n$ each having a thickness ranging from 105 μm to 630 μm, inclusive. Second circuit 13 includes a plurality of second conductor wirings $13_1$ to $13_m$ each having a thickness ranging from 105 μm to 630 μm, inclusive. Herein, n is an integer number of more than or equal to 2, and m is an integer number of more than or equal to 2. Note that, in FIG. 1, first conductor wirings $12_3$ to $12_n$ and second conductor wirings $13_3$ to $13_m$ are omitted.

First insulating resin layer 20C covers first surface 10A of printed wiring board 10 on which first circuit 12 is disposed, and includes cured product 21C of a second resin composition and does not include a fibrous base material as illustrated in FIG. 1. First insulating base material layer 30C covers first insulating resin layer 20C and includes cured product 31C of a third resin composition and second fibrous base material 32 as illustrated in FIG. 1. First conductor layer 40 convers first insulating base material layer 30C as illustrated in FIG. 1.

Second insulating resin layer 50C convers second surface 10B of printed wiring board 10 on which second circuit 13 is disposed, and includes cured product 51C of a fourth resin composition and does not include a fibrous base material as illustrated in FIG. 1. Second insulating base layer 60C covers second insulating resin layer 50C, and includes cured product 61C of a fifth resin composition and third fibrous base material 62. Second conductor layer 70 covers second insulating base material layer 60C.

In the exemplary embodiment, even when a thickness of each of first circuit 12 and second circuit 13 ranges from 105 μm to 630 μm, inclusive, thick conductor built-in type printed wiring board 1 includes first insulating resin layer 20C and second insulating resin layer 50C, and does not include a void whose diameter is more than or equal to 10 μm inside thick conductor built-in type printed wiring board 1. This enables to keep excellent electrical insulating properties even when an electronic component is mounted thereon by reflow soldering. Whether or not a void whose diameter is more than or equal to 10 μm is included inside thick conductor built-in type printed wiring board 1 can be measured by the same method as that described in examples.

Distance $T_A$ between first circuit 12 and first conductor layer 40 ranges preferably from 20 μm to 1000 μm, inclusive, and more preferably from 50 μm to 300 μm, inclusive. When distance $T_A$ is within the above-mentioned range, short circuit between first circuit 12 and first conductor layer 40 can be surely prevented. Distance $T_B$ between second circuit 13 and second conductor layer 70 ranges preferably from 20 μm to 1000 μm, inclusive, and more preferably from 50 μm to 300 μm, inclusive. When distance $T_B$ is within the above range, short circuit between second circuit 13 and second conductor layer 70 can be surely prevented.

Note that, in the exemplary embodiment, second insulating resin layer 50C, second insulating base material layer 60C, and second conductor layer 70 are stacked on second surface 10B of printed wiring board 10. However, the present disclosure is not limited thereto, and the second insulating resin layer, the second insulating base material layer, and the second conductor layer may not be stacked on the second surface of the printed wiring board.

[Printed Wiring Board]

Printed wiring board 10 includes insulating layer 11, first circuit 12, and second circuit 13. First circuit 12 is disposed on first surface 11A of insulating layer 11 as illustrated in FIG. 1. Second circuit 13 is disposed on second surface 11B of insulating layer 11 as illustrated in FIG. 1.

(First Circuit)

First circuit 12 includes a plurality (n pieces) of first conductor wirings $12_1$ to $12_n$. A shape of a pattern of first circuit 12 is not specifically limited, and may be designed as appropriate depending on usage of thick conductor built-in type printed wiring board 1.

Thickness $T_{12}$ of first conductor wiring $12_1$ ranges from 105 μm to 630 μm, inclusive, and preferably from 210 μm to 420 μm, inclusive. When the thickness of first conductor wiring $12_1$ is less than 105 μm, heat can be difficult to be radiated because of low current capacity. When the thickness of first conductor wiring $12_1$ exceeds 630 μm, a void may remain during molding. It is sufficient that width $W_{12}$ of first conductor wiring $12_1$ is designed depending on usage of thick conductor built-in type printed wiring board 1 as appropriate, and width $W_{12}$ of first conductor wiring $12_1$ is preferably more than or equal to 400 μm, and more preferably more than or equal to 800 μm.

First conductor wirings $12_2$ to $12_n$ are configured like first conductor wiring $12_1$.

Distance $D_{12}$ between adjacent two of first conductor wirings $12_1$ to $12_n$ is preferably more than or equal to 400 μm, and more preferably more than or equal to 800 μm.

For example, copper, aluminum, stainless steel, or the like can be used as a material forming first circuit 12, but copper is preferably used among them. When the material of first circuit 12 is copper, any of electrolytic copper and rolled copper may be employed.

It is preferable that at least one surface of first circuit 12 is a matte surface. In this case, one surface of first circuit 12 may be a matte surface and the other surface thereof may be a shiny surface, or both surfaces of first circuit 12 may be the matte surface. When the matte surface of first circuit 12 is disposed to face insulating layer 11, peel strength between first circuit 12 and insulating layer 11 in thick conductor built-in type printed wiring board 1 can be improved due to an anchor effect.

Ten-point average roughness ($R_{ZJIS}$) of the matte surface of the first circuit is not specifically limited, but ranges preferably from 0.5 µm to 5.0 µm, inclusive. Ten-point average roughness ($R_{ZJIS}$) of the shiny surface of the first circuit is not specifically limited, but ranges preferably from 0.5 µm to 2.5 µm, inclusive. On the matte surface, larger number of irregularities that are more precise than those on the shiny surface are formed as compared with the shiny surface.

Herein, ten-point average roughness ($R_{ZJIS}$) is regulated by JIS B0601:2013. And ten-point average roughness ($R_{ZJIS}$) is obtained by the following procedures. A portion of a roughness curve is taken out by a reference length in a direction of its average line. Next, an average value of absolute values of elevations (Yp) of from a highest peak to a fifth high peak is calculated, and an average value of absolute values of elevations (Yv) of from a lowest valley bottom to a fifth valley bottom is calculated. Herein, absolute values of elevations (Yp) and (Yv) are measured from the average line of the taken-out portion in a direction of vertical magnification. Finally, ten-point average roughness ($R_{ZJIS}$) is represented by a value in a unit of micrometer (µm) obtained by summing the average value of absolute values of elevations (Yp) and the average value of absolute values of elevations (Yv).

Note that, in the exemplary embodiment, thicknesses $T_{12}$ of the plurality of first conductor wirings $12_1$ to $12_n$ are same. However, the present disclosure is not limited thereto, and the thicknesses of the plurality of first conductor wirings may be different from each other as long as the thicknesses of the plurality of first conductor wirings ranges from 105 µm to 630 µm, inclusive. Also, in the exemplary embodiment, a cross-sectional shape of the plurality of first conductor wirings $12_1$ to $12_n$ is a substantially trapezoid shape as illustrated in FIG. 1. However, the present disclosure is not limited thereto, and may be a trapezoid shape, a rectangular shape, a square shape, or the like.

(Second Circuit)

Second circuit 13 includes a plurality of (m pieces) of second conductor wirings $13_1$ to $13_m$. A shape of a pattern of second circuit 13 is not specifically limited, and may be designed as appropriate depending on usage of thick conductor built-in type printed wiring board 1.

Thickness $T_{13}$ of second conductor wiring $13_1$ ranges from 105 µm to 630 µm, inclusive, and preferably from 210 µm to 420 µm, inclusive. When the thickness of second conductor wiring $13_1$ is less than 105 µm, heat can be difficult to be radiated because of low current capacity. When the thickness of second conductor wiring $13_1$ exceeds 630 µm, a void may remain during molding. It is sufficient that width $W_{13}$ of second conductor wiring $13_1$ is designed depending on usage of thick conductor built-in type printed wiring board 1 as appropriate, and width $W_{13}$ of second conductor wiring $13_1$ is preferably more than or equal to 400 µm, and more preferably more than or equal to 800 µm.

Second conductor wirings $13_2$ to $13_m$ are configured like second conductor wiring $13_1$.

Distance $D_{13}$ between adjacent two of second conductor wirings $13_1$ to $13_m$ is preferably more than or equal to 400 µm, and more preferably more than or equal to 800 µm.

As a material forming second circuit 13, the same material exemplified as the material forming first circuit 12 can be used.

It is preferable that at least one surface of second circuit 13 is a matte surface. In this case, one surface of second circuit 13 may be a matte surface and the other surface thereof may be a shiny surface, or both surfaces of second circuit 13 may be the matte surface. When the matte surface of second circuit 13 is disposed to face insulating layer 11, peel strength between second circuit 13 and insulating layer 11 in thick conductor built-in type printed wiring board 1 can be improved due to an anchor effect.

Ten-point average roughness ($R_{ZJIS}$) of the matte surface of the second circuit is not specifically limited, but ranges preferably from 0.5 µm to 5.0 µm, inclusive. Ten-point average roughness ($R_{ZJIS}$) of the shiny surface of the first circuit is not specifically limited, but ranges preferably from 0.5 µm to 2.5 µm, inclusive. On the matte surface, larger number of irregularities that are more precise than those on the shiny surface are formed as compared with the shiny surface.

Note that, in the exemplary embodiment, thicknesses $T_{13}$ of the plurality of second conductor wirings $13_1$ to $13_m$ are same. However, the present disclosure is not limited thereto, and the thicknesses of the plurality of second conductor wirings may be different from each other as long as the thicknesses of the plurality of second conductor wirings ranges from 105 µm to 630 µm, inclusive. Also, in the exemplary embodiment, a cross-sectional shape of the plurality of second conductor wirings $13_1$ to $13_m$ is a substantially trapezoid shape as illustrated in FIG. 1. However, the present disclosure is not limited thereto, and may be a trapezoid shape, a rectangular shape, a square shape, or the like.

(Insulating Layer)

Insulating layer 11 includes cured product 111 of the first resin composition, and first fibrous base material 112. A thickness of insulating layer 11 ranges preferably from 50 µm to 2000 µm, inclusive.

The first resin composition can contain, for example, a thermosetting resin, and may further include a curing agent, a curing accelerator, an inorganic filler, a flame retardant, or the like as needed. Examples of the thermosetting resin include an epoxy resin, a polyimide resin, a phenolic resin, and a bismaleimide triazine resin. Examples of the thermosetting resin include a diamine-based curing agent, a bifunctional or more phenolic curing agent, an acid anhydride-based curing agent, dicyandiamide, and a low molecular weight polyphenylene ether compound. Examples of the diamine-based curing agent include primary amine and secondary amine. Examples of the curing accelerator include an imidazole compound, a tertiary amine compound, an organic sulfonic compound, and metal soap. An example of the imidazole compound is 2-ethyl-4-methylimidazole (2E4 mZ). Examples of the inorganic filler include silica, a molybdenum compound, aluminum hydroxide, magnesium hydroxide, aluminum silicate, magnesium silicate, talc, clay, and mica. An example of the molybdenum compound is molybdenum trioxide. One of these materials may be used alone, or two or more of these materials may be mixed for use. Examples of the flame retardant include a halogen-based flame retardant and a non-halogen-based flame retardant. An example of the halogen-based flame retardant is a bromine-containing compound. Examples of the non-halogen-based flame retardant include a phosphorus-containing compound and a nitrogen-containing compound. In a case where the first resin composition contains the inorganic filler, a content ratio of the inorganic filler ranges preferably from 30 parts by mass to 300 parts by mass, inclusive, with respect to 100 parts by mass of total mass of the first resin component.

As first fibrous base material 112, for example, woven cloth or non-woven cloth formed of glass fiber; woven cloth or non-woven cloth formed of organic fiber; woven cloth or non-woven cloth formed of inorganic fiber other than glass fiber, or the like can be used. Examples of the organic fiber include aramid fiber, polyp araphenylene benzobisoxazole (PBO) fiber, polybenzimidazole (PBI) fiber, polytetrafluoroethylene (PTFE) fiber, polybenzimidazole (PBI) fiber, polytetrafluoroethylene (PTFE) fiber, poly-para-phenylenebenzobisthiazole (PBZT) fiber, and totally aromatic polyester fiber. Textile fabric of first fibrous base material 112 is not specifically limited, and examples thereof include plain fabric and twill fabric. Examples of glass composition of the glass fiber include E glass, D glass, S glass, NE glass, T glass, and quartz. First fibrous base material 112 may be subjected to opening treatment or may be subjected to surface treatment using a silane coupling agent or the like.

Note that, in the exemplary embodiment, insulating layer 11 includes first fibrous base material 112. However, the present disclosure is not limited thereto, and the insulating layer may include no fibrous base material.

[Insulating Resin Layer]
(First Insulating Resin Layer)

First insulating resin layer 20C contains cured product 21C of the second resin composition, and does not contain a fibrous base material. As illustrated in FIG. 1, first insulating resin layer 20C covers first surface 11A of printed wiring board 10. In this manner, in the exemplary embodiment, first insulating resin layer 20C that does not contain a fibrous base material is disposed between printed wiring board 10 and first insulating base material layer 30C. Hence, it is possible to prevent cloth touch between first circuit 12 and second fibrous base material 32. This enables thick conductor built-in type printed wiring board 1 to keep excellent electrical insulation properties even when an electronic component is mounted thereon by reflow soldering.

Thickness $T_{20D}$ of first insulating resin layer 20C between every two adjacent first conductor wirings among first conductor wirings $12_1$ to $12_n$ (hereinafter, first adjacent portion $1A_1$) is preferably more than or equal to 20 µm, and more preferably more than or equal to 50 µm. Thickness $T_{20W}$ of a portion excluding first adjacent portion $1A_1$ of first insulating resin layer 20C (hereinafter, first covering portion $1A_2$) is preferably more than or equal to 10 µm.

As the second resin composition, the same resin composition as that exemplified as the first resin composition can be used. When the second resin composition contains the inorganic filler, a content ratio of the inorganic filler ranges preferably from 50 parts by mass to 900 parts by mass, inclusive, and more preferably from 100 parts by mass to 500 parts by mass, inclusive, with respect to 100 parts by mass of a solid content of the second resin composition. When the content ratio of the inorganic filler is within the above-mentioned range, uncured product 21U of the second resin composition is superior in flow property. Hence, it is difficult that a void is generated inside thick conductor built-in type printed wiring board 1. This also enables to lower a coefficient of thermal expansion (CTE) of first insulating resin layer 20C.

A minimum melt viscosity of the second resin composition ranges preferably from $1 \times 10^2$ Pa·s to $1 \times 10^6$ Pa·s, inclusive, and more preferably from $1 \times 10^4$ Pa·s to $1 \times 10^6$ Pa·s, inclusive. The temperature at which the minimum melt viscosity of the second resin composition is obtained ranges preferably from 60° C. to 130° C., inclusive, and more preferably from 80° C. to 110° C., inclusive.

The minimum melt viscosity is defined as a viscosity in a case where a resin composition is melted to become the lowest viscosity. The temperature at which the minimum melt viscosity of the resin composition is obtained can be measured as a temperature at which viscosity is lowest in measurement of viscosity of the resin composition while increasing a temperate at a rate of 2° C./min using a rheometer.

Note that, in the exemplary embodiment, thickness $T_{20D}$ of first adjacent portion $1A_1$ of first insulating resin layer 20C is thinner than thickness $T_{12}$ of first conductor wiring 12. However, the present disclosure is not limited thereto, and the thickness of the first adjacent portion of the first insulating resin layer may be equal to the thickness of the first conductor wiring, or may be thicker than the thickness of the first conductor wiring.

(Second Insulating Resin Layer)

Second insulating resin layer 50C includes cured product 51C of the fourth resin composition, and does not include a fibrous base material. As illustrated in FIG. 1, second insulating resin layer 50C covers second surface 11B of printed wiring board 10. In this manner, in the exemplary embodiment, second insulating resin layer 50C that does not include a fibrous base material is disposed between printed wiring board 10 and second insulating base material layer 60C. Hence, it is possible to prevent cloth touch between second circuit 13 and third fibrous base material 62. This enables thick conductor built-in type printed wiring board 1 to keep excellent electrical insulation properties even when an electronic component is mounted thereon by reflow soldering.

Thickness $T_{50D}$ of second insulating resin layer 50C between every two adjacent second conductor wirings among second conductor wirings $13_1$ to $13_m$ (hereinafter, second adjacent portion $1B_1$) is preferably more than or equal to 20 µm, and more preferably more than or equal to 50 µm. Thickness $T_{50W}$ of a portion excluding second adjacent portion $1B_1$ of second insulating resin layer 50C (hereinafter, second covering portion $1B_2$) is preferably more than or equal to 10 µm.

As the fourth resin composition, the same resin composition as that exemplified as the first resin composition can be used. When the fourth resin composition contains the inorganic filler, a content ratio of the inorganic filler ranges preferably from 50 parts by mass to 900 parts by mass, inclusive, and more preferably from 100 parts by mass to 500 parts by mass, inclusive, with respect to 100 parts by mass of a solid content of the fourth resin composition. When the content ratio of the inorganic filler is within the above-mentioned range, uncured product 51U of the fourth resin composition is excellent in flow property. Hence, it is difficult that a void is generated inside thick conductor built-in type printed wiring board 1. This also enables to lower a coefficient of thermal expansion (CTE) of second insulating resin layer 50C.

A minimum melt viscosity of the fourth resin composition ranges preferably from $1 \times 10^2$ Pa·s to $1 \times 10^6$ Pa·s, inclusive, and more preferably from $1 \times 10^4$ Pa·s to $1 \times 10^6$ Pa·s, inclusive. The temperature at which the minimum melt viscosity of the fourth resin composition is obtained ranges preferably from 60° C. to 130° C., inclusive, and more preferably from 80° C. to 110° C., inclusive.

Note that, in the exemplary embodiment, thickness $T_{50D}$ of second adjacent portion $1B_1$ of second insulating resin layer 50C is thinner than thickness $T_{13}$ of second conductor wiring 13. However, the present disclosure is not limited thereto, and the thickness of the second adjacent portion of the second insulating resin layer may be equal to the thickness of the second conductor wiring, or may be thicker than the thickness of the second conductor wiring.

[Insulating Base Material Layer]
(First Insulating Base Material Layer)

First insulating base material layer 30C includes cured product 31C of the third resin composition and second fibrous base material 32. First insulating base material layer 30C covers first insulating resin layer 20C as illustrated in FIG. 1. In this manner, in the exemplary embodiment, first insulating base material layer 30C is disposed between first circuit 12 and first conductor layer 40. Hence, it is possible to ensure a distance between first circuit 12 and first conductor layer 40. This enables to prevent short circuit between first circuit 12 and first conductor layer 40.

As the third resin composition, the same resin composition as that exemplified as the first resin composition can be used. When the third resin composition contains the inorganic filler, a content ratio of the inorganic filler ranges preferably from 30 parts by mass to 300 parts by mass, inclusive, with respect to 100 parts by mass of a solid content of the third resin composition.

A minimum melt viscosity of the third resin composition ranges preferably from $1\times10^2$ Pa·s to $1\times10^5$ Pa·s, inclusive, and more preferably from $1\times10^2$ Pa·s to $1\times10^4$ Pa·s, inclusive. The temperature at which the minimum melt viscosity of the third resin composition is obtained is preferably more than or equal to the temperature at which the minimum melt viscosity of the second resin composition is obtained and less than or equal to 170° C.

As second fibrous base material 32, the same fibrous base material as that exemplified as first fibrous base material 112 can be used. Thickness $T_{32}$ of second fibrous base material 32 ranges preferably from 20 μm to 300 μm, inclusive. In a case where first insulating base material layer 30C is, for example, a cured product of laminated body in which a plurality of prepregs 31U are overlapped, the thickness of second fibrous base material 32 denotes a total of thicknesses of the plurality of second fibrous base materials 32 and thicknesses of cured products of the third resin composition between respective two adjacent second fibrous base materials 32. Herein, each of prepregs 31U includes second resin base material 32 and a half-cured product (B stage state) of the third resin composition impregnated in second resin base material 32

(Second Insulating Base Material Layer)

Second insulating base material 60C includes cured product 61C of the fifth resin composition and third fibrous base material 62. Second insulating base material layer 60C covers second insulating resin layer 50C as illustrated in FIG. 1. In this manner, in the exemplary embodiment, second insulating base material layer 60C is disposed between second circuit 13 and second conductor layer 70. Hence, it is possible to ensure a distance between second circuit 13 and second conductor layer 70. This enables to prevent short circuit between second circuit 13 and second conductor layer 70.

As the fifth resin composition, the same resin composition as that exemplified as the first resin composition can be used. When the fifth resin composition contains the inorganic filler, a content ratio of the inorganic filler ranges preferably from 30 parts by mass to 300 parts by mass, inclusive, with respect to 100 parts by mass of a solid content of the fifth resin composition.

A minimum melt viscosity of the fifth resin composition ranges preferably from $1\times10^2$ Pa·s to $1\times10^5$ Pa·s, inclusive, and more preferably from $1\times10^2$ Pa·s to $1\times10^4$ Pa·s, inclusive. The temperature at which the minimum melt viscosity of the fifth resin composition is obtained is preferably more than or equal to the temperature at which the minimum melt viscosity of the fourth resin composition is obtained and less than or equal to 170° C.

As third fibrous base material 62, the same fibrous base material as that exemplified as first fibrous base material 112 can be used. Thickness $T_{62}$ of third fibrous base material 62 ranges preferably from 20 μm to 300 μm, inclusive. In a case where second insulating base material layer 60C is, for example, a cured product of laminated body in which a plurality of prepregs 61U are overlapped, the thickness of third fibrous base material 62 denotes a total of thicknesses of the plurality of third fibrous base materials 62 and thicknesses of cured products of the fifth resin composition between respective two adjacent third fibrous base materials 62. Herein, each of prepregs 61U includes third resin base material 62 and a half-cured product (B stage state) of the fifth resin composition impregnated in third resin base material 62

[Conductor Layer]
(First Conductor Layer)

First conductor layer 40 covers first insulating base material layer 30C as illustrated in FIG. 1.

A form of first conductor layer 40 is a foil shape that is not patterned. A thickness of first conductor layer 40 ranges preferably from 2 μm to 40 μm, inclusive, and more preferably from 2 μm to 20 μm, inclusive.

As the material forming first conductor layer 40, the same material as that exemplified as the material forming first circuit 12 can be used.

It is preferable that at least one surface of first conductor layer 40 is a matte surface. In this case, one surface of first conductor layer 40 may be a matte surface and the other surface of first conductor layer 40 may be a shiny surface, or both surfaces of first conductor layer 40 may be the matte surface. When the matte surface of first conductor layer 40 is disposed to face first insulating base material layer 30C, peel strength between first conductor layer 40 and first insulating base material layer 30C in thick conductor built-in type printed wiring board 1 can be improved due to an anchor effect.

Ten-point average roughness ($R_{ZJIS}$) of the matte surface of first conductor layer 40 is not specifically limited, but ranges preferably from 0.5 μm to 5.0 μm, inclusive. Ten-point average roughness ($R_{ZJIS}$) of the shiny surface of the first circuit is not specifically limited, but ranges preferably from 0.5 μm to 2.5 μm, inclusive. On the matte surface, larger number of irregularities that are more precise than those on the shiny surface are formed as compared with the shiny surface.

(Second Conductor Layer)

Second conductor layer 70 covers second insulating base material layer 60C as illustrated in FIG. 1.

A form of second conductor layer 70 is a foil shape that is not patterned. A thickness of second conductor layer 70 ranges preferably from 2 μm to 40 μm, inclusive, and more preferably from 2 μm to 20 μm, inclusive.

As the material forming second conductor layer 70, the same material as that exemplified as the material forming first circuit 12 can be used.

It is preferable that at least one surface of second conductor layer 70 is a matte surface. In this case, one surface of second conductor layer 70 may be a matte surface and the other surface of second conductor layer 70 may be a shiny surface, or both surfaces of second conductor layer 70 may be the matte surface. When the matte surface of second conductor layer 70 is disposed to face second insulating base material layer 60C, peel strength between second conductor layer 70 and second insulating base material layer 60C in thick conductor built-in type printed wiring board 1 can be improved due to an anchor effect.

Ten-point average roughness ($R_{ZJIS}$) of the matte surface of second conductor layer 70 is not specifically limited, but ranges preferably from 0.5 μm to 5.0 μm, inclusive. Ten-point average roughness ($R_{ZJIS}$) of the shiny surface of the first circuit is not specifically limited, but ranges preferably from 0.5 μm to 2.5 μm, inclusive. On the matte surface, larger number of irregularities that are more precise than those on the shiny surface are formed as compared with the shiny surface.

[Method for Producing Thick Conductor Built-in Type Printed Wiring Board]

Figure 2A:
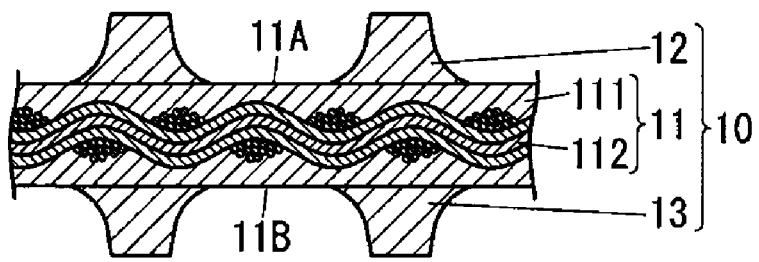
FIG. 2A is a schematic cross-sectional view in step (A) in a method for producing a thick conductor built-in type printed wiring board according to the exemplary embodiment of present disclosure.
Figure 2B:
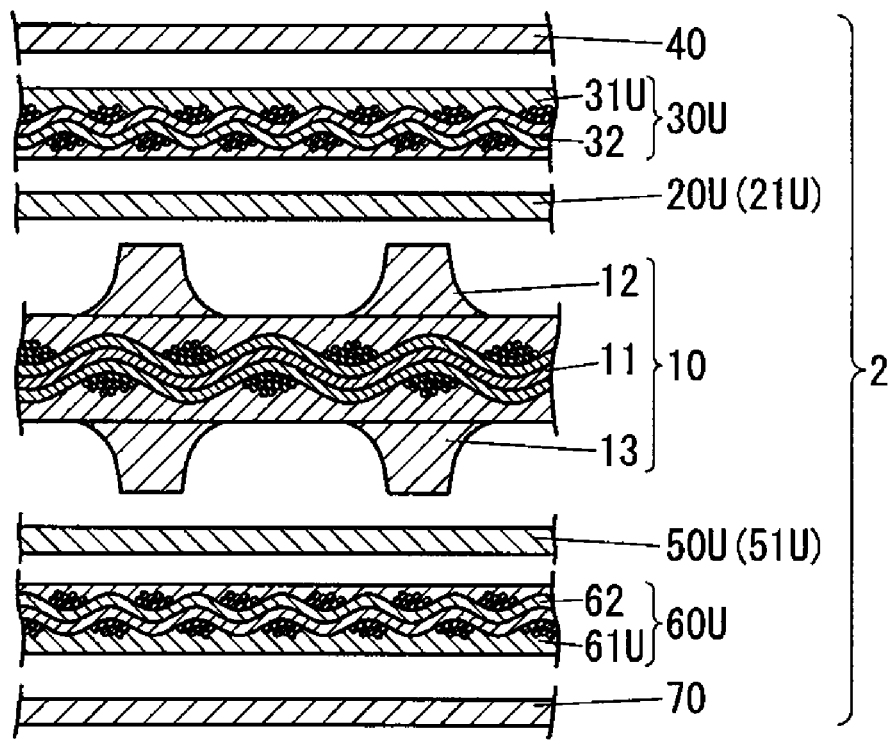
FIG. 2B is a schematic cross-sectional view in step (B) in the method for producing the thick conductor built-in type printed wiring board according to the exemplary embodiment of the present disclosure.
Figure 2C:
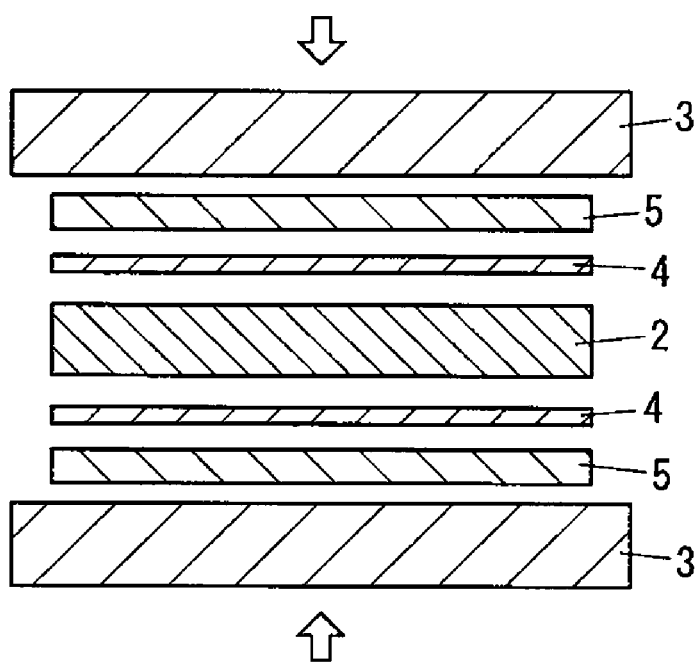
FIG. 2C is a schematic cross-sectional view in step (C) in the method for producing the thick conductor built-in type printed wiring board according to the exemplary of the present disclosure.

FIG. 2A is a schematic cross-sectional view of step (A) in a method for producing the thick conductor built-in type printed wiring board according to the exemplary embodiment. FIG. 2B is a schematic cross-sectional view of step (B) in the method for producing the thick conductor built-in type printed wiring board according to the exemplary embodiment. FIG. 2C is a schematic cross-sectional view of step (C) in the method for producing the thick conductor built-in type printed wiring board according to the exemplary embodiment. In FIG. 2A and FIG. 2B, the same reference marks are used for the same constituent elements as those illustrated in FIG. 1, and description thereof is omitted.

The method for producing the thick conductor built-in type printed wiring board according to the exemplary embodiment includes step (A), step (B), and step (C) to be described below. Step (A), step (B), and step (C) are performed in this order.

Step (A) is a step of preparing printed wiring board 10 illustrated in FIG. 2A.

Step (B) is a step of overlapping second conductor layer 70, second prepreg 60U including uncured product 61U of the fifth resin composition, second resin layer 50U including uncured product 51U of the fourth resin composition, printed wiring board 10, first resin layer 20U including uncured product 21U of the second resin composition, first prepreg 30U including uncured product 31U of the third resin composition, and first conductor layer 40 in this order to form laminated body 2 as illustrated in FIG. 2B.

Step (C) is a step of disposing laminated body 2 between hot plates 3, 3, and heating and compressing those components for integral lamination as illustrated in FIG. 2C.

The exemplary embodiment includes step (A) to step (C), so that crack is less likely to be generated in the insulating base material layer even when an electronic component is mounted by reflow soldering. Hence, thick conductor built-in type printed wiring board 1 that keeps superior electrical insulating properties cab be obtained.

[Step (A)]

In step (A), printed wiring board 10 illustrated in FIG. 2A is prepared.

Examples of a method for preparing printed wiring board 10 include a producing method including a preparing step and a circuit forming step. In the preparing step, insulating layer 11, and a double-sided metal-clad laminate equipped with a first metal layer provided on first surface 11A of insulating layer 11 and a second metal layer provided on second surface 11B of insulating layer 11 are prepared. A form of each of the first metal layer and the second metal layer is a foil shape that is not patterned. In the circuit forming step, the first metal layer and the second metal layer are subjected to wiring forming processing to obtain printed wiring board 10 as illustrated in FIG. 2A.

In the preparing step, as a method for preparing the double-sided metal-clad laminate, for example, it is sufficient that a first metal foil corresponding to the first metal layer, a third prepreg corresponding to insulating layer 11, and a second metal foil corresponding to the second metal layer are laminated for heat-compression-molding. Examples of a method for heat-compression-molding include multistage vacuum press, double belt press, linear pressure roll, and vacuum laminator. A method for wiring formation processing is not specifically limited, and examples thereof include known circuit formation methods such as a subtractive method and a semi-additive method.

[Step (B)]

In step (B), as illustrated in FIG. 2B, second conductor layer 70, second prepreg 60U, second resin layer 50U, printed wiring board 10, first resin layer 20U, first prepreg 30U, and first conductor layer 40 are laminated in this order to form laminated body 2.

First resin layer 20U includes uncured product 21U of the second resin composition, and does not include a fibrous base material. First prepreg 30U includes second fibrous base material 32 and uncured product 31U of the third resin composition impregnated in second fibrous base material 32. Second resin layer 50U includes uncured product 51U of fourth resin composition, and does not include the fibrous base material. Second prepreg 60U includes third fibrous base material 62 and uncured product 61U of fifth resin composition impregnated in third fibrous base material 62.

A form of each of uncured product 21U of the second resin composition and uncured product 51U of the fourth resin composition may be a sheet shape, or a varnish shape. The sheet shape is preferable among them because of easy handling.

A thickness of uncured product 21U of the second resin composition having the sheet shape (hereinafter, first resin sheet 21U) is preferably more than or equal to 0.2 times and less than or equal to 2.0 times, and more preferably more than or equal to 0.5 times and less than or equal to 1.0 time with respect to thickness $T_{12}$ of first circuit 12. Specifically, the thickness of first resin sheet 21U ranges preferably from 100 μm to 320 μm, inclusive. A thickness of uncured product 51U of the fourth resin composition having the sheet shape (hereinafter, second resin sheet 51U) is preferably more than or equal to 0.2 times and less than or equal to 2.0 times, and more preferably more than or equal to 0.5 times and less than or equal to 1.0 time with respect to thickness $T_{13}$ of second circuit 13. Specifically, the thickness of second resin sheet 51U ranges preferably from 100 μm to 320 μm, inclusive.

In the second resin composition, the minimum melt viscosity ranges preferably from $1 \times 10^2$ Pa·s to $1 \times 10^6$ Pa·s, inclusive, and the temperature at which the minimum melt viscosity is obtained ranges preferably from 60° C. to 130° C., inclusive. In the third resin composition, the minimum melt viscosity ranges preferably from $1 \times 10^2$ Pa·s to $1 \times 10^5$ Pa·s, inclusive, and the temperature at which the minimum melt viscosity is obtained is preferably more than or equal to the temperature at which the minimum melt viscosity of the second resin composition is obtained and less than or equal to 170° C. Likewise, in the fourth resin composition, the minimum melt viscosity ranges preferably from $1 \times 10^2$ Pa·s to $1 \times 10^6$ Pa·s, inclusive, and the temperature at which the minimum melt viscosity is obtained ranges preferably from 60° C. to 130° C., inclusive. In the fifth resin composition, the minimum melt viscosity ranges preferably from $1 \times 10^2$ Pa·s to $1 \times 10^5$ Pa·s, inclusive, and the temperature at which the minimum melt viscosity is obtained is preferably more than or equal to the temperature at which the minimum melt viscosity of the fourth resin composition is obtained and less than or equal to 170° C. This makes it possible to make a void having a diameter of more than or equal to 10 µm be less likely be generated and make cloth touch be less likely to be occurred inside resultant thick conductor built-in type printed wiring board 1.

An order of overlapping second conductor layer 70, second prepreg 60U, second resin layer 50U, printed wiring board 10, first resin layer 20U, first prepreg 30U, and first conductor layer 40 as well as a lamination method thereof are not specifically limited.

More than or equal to two of each of second prepreg 60U, second resin layer 50U, first resin layer 20U, and first prepreg 30U may be overlapped to be disposed.

[Step (C)]

In step (C), as illustrated in FIG. 2C, laminated body 2 is disposed between hot plates 3, 3 to be heated and compressed for integral lamination. This makes uncured product 21U of the second resin composition, uncured product 31U of the third resin composition, uncured product 51U of the fourth resin composition, and uncured product 61U of the fifth composition be cured to obtain thick conductor built-in type printed wiring board 1.

Methods for heating and compressing laminated body 2 include a method that sandwiches laminated body 2 with molding plates 4, 4 and cushion materials 5, 5 and further sandwiches them with hot plates 3, 3 that is a molding device for compression-molding as illustrated in FIG. 2C, and the like. Heated heat medium is circulated in hot plate 3, and laminated body 2 is heated via hot plates 3, 3. As a material forming molding plate 4, stainless steel or the like can be used. As a material forming cushion material 5, Kraft paper, felt, or the like can be used.

In conditions of compressing and molding laminated body 2, as for compressing, for example, it is sufficient that laminated body 2 is subjected to two stage pressure in which laminated body 2 is compressed at primary pressure for a predetermined time after molding is started, and compressed at secondary pressure set higher than the primary pressure thereafter. As for heating, it is sufficient that, for example, a temperature of the hot plates is increased to a set temperature (maximum temperature), and the temperature of hot plates 3, 3 is lowered for cooling after the hot plates are kept at the maximum temperature for a predetermined time.

In this context, compression of laminated body 2 is preferably started when the temperature of hot plates 3,3 disposed between laminated body 2 to be heated becomes within a range of more than or equal to the temperature lower by 20° C. than the temperature at which the minimum melt viscosity of the third resin composition is obtained and less than or equal to the temperature higher by 20° C. than the temperature at which the minimum melt viscosity of the third resin composition is obtained. By this step, thick conductor built-in type printed wiring board 1 that has no void having a diameter of more than or equal to 10 µm therein can be obtained.

Unit pressure of the primary compression may be any pressure as long as laminated body 2 and molding plates 4, 4 are sufficiently in contact with each other, and ranges preferably from 0.2 MPa to 0.8 MPa, inclusive. Unit pressure of the secondary compression ranges preferably from 1.0 MPa to 5.0 MPa, inclusive, and more preferably from 1.0 MPa to 2.0 MPa, inclusive. A temperature rising speed to the maximum temperature ranges preferably from 1.0° C./min to 6.0° C./min, inclusive. It is sufficient that the maximum temperature is adjusted as appropriate depending on materials of uncured product 21U of the second resin composition, uncured product 31U of the third resin composition, uncured product 51U of the fourth resin composition, and the uncured product 61U of the fifth resin composition. And the maximum temperature ranges preferably from 160° C. to 230° C., inclusive. A temperature cooling speed to a room temperature ranges preferably from 2° C./min to 20° C./min, inclusive. Molding time for compression-molding laminated body 2 is set such that uncured product 21U of the second resin composition, uncured product 31U of the third resin composition, uncured product 51U of the fourth resin composition, and uncured product 61U of the fifth resin composition are sufficiently cured. And molding time for compression-molding laminated body 2 ranges preferably from 120 minutes to 360 minutes, inclusive, which includes cooling time.

EXAMPLES

Hereinafter, the present disclosure will be specifically described using examples.

Examples 1 to 9 and Comparative Examples 1 to 5

Following materials were prepared to produce a thick conductor built-in type printed wiring board.

Resin sheets shown in Table 1 to Table 3 were prepared as first resin layer 20U and second resin layer 50U. Prepregs shown in Table 1 to Table 3 were prepared as first prepreg 30U and second prepreg 60U. Copper foils ("3EC-3" produced by MITSUI MINING & SMELTING CO., LTD., thickness: 18 µm) were prepared as first conductor layer 40 and second conductor layer 70. A prepreg ("R-1570" produced by Panasonic Corporation, thickness: 200 µm) was prepared as the third prepreg. Copper foils (produced by Nikko Gould Foil Co., Ltd.) was prepared as the first metal layer and the second metal layer.

The first metal layer, the two third prepregs, and the second metal layer were overlapped in this order and subjected to heat-compression-molding for 90 minutes under conditions of 200° C., 3 MPa to obtain a double-sided metal-clad laminate (thickness of insulating layer: 0.4 mm). The first metal layer and the second metal layer of the resultant double-sided metal-clad laminate were subjected to wiring formation processing by etching to form first circuit 12 and second circuit 13 to obtain printed wiring board 10 as illustrated in FIG. 2A. Distance $D_{12}$ between adjacent two of first conductor wirings $12_1$ to $12_n$ was more than or equal to 1000 µm and less than or equal to 1200 µm. Distance $D_{13}$ between adjacent two of second conductor wirings $13_1$ to $13_m$ was more than or equal to 1000 µm and less than or equal to 1200 µm.

The thicknesses of first circuit 12 and second circuit 13 in resultant printed wiring board 10 are illustrated in Table 1 and Table 2. Note that, thickness $T_{12}$ of first circuit 12 and thickness $T_{13}$ of second circuit 13 are identical, and are collectively referred to as "conductor thickness" in Table 1 and Table 2. Both residual copper rate of first surface 10A of printed wiring board 10 and residual copper rate of second surface 10B of printed wiring board 10 were 60%.

As illustrated in FIG. 2B, second conductor layer 70, second prepreg 60U, second resin layer 50U, printed wiring board 10, first resin layer 20U, first prepreg 30U, and first conductor layer 40 are overlapped in this order to form laminated body 2.

As illustrated in FIG. 2C, laminated body 2 is disposed between hot plates 3, 3, sandwiched by molding plates 4, 4 and cushion materials 5, 5, and further sandwiched by hot plates 3, 3 serving as a molding device, for subjecting them to heat-compression-molding for integral lamination. This provides the thick conductor built-in type printed wiring board.

As for compression conditions of the heat-compression-molding, laminated body 2 was compressed at 0.5 MPa (primary pressure) after molding was started and was compressed at 1.5 MPa (secondary pressure) when the temperature of hot plates 3, 3 became a compression start temperature illustrated in Table 1 and Table 2. As for heating conditions, the temperature of hot plates 3,3 was increased at a rate of 2.0° C./min after molding was started, kept at 200° C. (maximum temperature) for 120 minutes, and cooled to a room temperature at a rate of 10° C./min.

TABLE 1

| | | | | Example 1 | Example 2 | Example 3 | Example 4 | Example 5 |
|---|---|---|---|---|---|---|---|---|
| Laminated body | Printed wiring board | Conductor thickness | [μm] | 420 | 420 | 420 | 420 | 210 |
| | Prepreg | Material name | — | Prepreg A | Prepreg A | Prepreg B | Prepreg B | Prepreg A |
| | | Number of laminations | [Number] | 2 | 2 | 2 | 2 | 2 |
| | Resin sheet | Material name | — | Sheet S | Sheet T | Sheet S | Sheet T | Sheet S |
| | | Number of laminations | [Number] | 2 | 2 | 2 | 2 | 1 |
| Heating and compressing conditions | Compression start temperature | | [° C.] | 130 | 130 | 130 | 130 | 130 |
| | [Compression start temperature] − [lowest melt viscosity temperature *1] | | [° C.] | −10 | −10 | 0 | 0 | −10 |
| Thick conductor built-in type printed wiring board | Embedding property | Presence or absence of void | — | OK | OK | OK | OK | OK |
| | | Presence or absence of close touch | — | OK | OK | OK | OK | OK |
| | Reflow heat resistance | Presence or absence of crack | — | OK | OK | OK | OK | OK |

| | | | | Example 6 | Example 7 | Example 8 | Example 9 |
|---|---|---|---|---|---|---|---|
| Laminated body | Printed wiring board | Conductor thickness | [μm] | 315 | 630 | 210 | 420 |
| | Prepreg | Material name | — | Prepreg A | Prepreg A | Prepreg C | Prepreg A |
| | | Number of laminations | [Number] | 2 | 2 | 2 | 2 |
| | Resin sheet | Material name | — | Sheet S | Sheet S | Sheet S | Sheet S |
| | | Number of laminations | [Number] | 1 | 3 | 1 | 2 |
| Heating and compressing conditions | Compression start temperature | | [° C.] | 130 | 130 | 130 | 110 |
| | [Compression start temperature] − [lowest melt viscosity temperature *1] | | [° C.] | −10 | −10 | −10 | −30 |
| Thick conductor built-in type printed wiring board | Embedding property | Presence or absence of void | — | OK | OK | OK | OK |
| | | Presence or absence of close touch | — | OK | OK | OK | OK |
| | Reflow heat resistance | Presence or absence of crack | — | OK | OK | OK | OK |

*1 temperature at which lowest melt viscosity of resin composition forming prepreg is obtained

TABLE 2

| | | | | Comparative Example 1 | Comparative Example 2 | Comparative Example 3 | Comparative Example 4 | Comparative Example 5 |
|---|---|---|---|---|---|---|---|---|
| Laminated body | Printed wiring board | Conductor thickness | [μm] | 420 | 420 | 210 | 420 | 420 |
| | Prepreg | Material name | — | Prepreg A | Prepreg A | Prepreg C | Prepreg D | Prepreg E |
| | | Number of laminations | [Number] | 2 | 4 | 2 | 2 | 2 |
| | Resin sheet | Material name | — | Sheet S | — | — | Sheet S | Sheet S |
| | | Number of laminations | [Number] | 2 | — | — | 2 | 2 |
| Heating and compressing conditions | Compression start temperature | | [° C.] | 90 | 130 | 130 | 130 | 130 |
| | [Compression start temperature] − [lowest melt viscosity temperature *1] | | [° C.] | −50 | −10 | −10 | −10 | 0 |
| Thick conductor built-in | Embedding property | Presence or absence of void | — | NG | OK | OK | OK | NG |

TABLE 2-continued

|  |  |  | Comparative Example 1 | Comparative Example 2 | Comparative Example 3 | Comparative Example 4 | Comparative Example 5 |
|---|---|---|---|---|---|---|---|
| type printed wiring board |  | Presence or absence of close touch | — | OK | NG | NG | NG | OK |
|  | Reflow heat resistance | Presence or absence of crack | — | NG | NG | NG | NG | NG |

*1 temperature at which lowest melt viscosity of resin composition forming prepreg is obtained

TABLE 3

| Material name | Product name | Glass cloth style | Resin amount [%] | Actual thickness [μm] | Lowest melt viscosity [Pa · s] | Temperature indicating lowest melt viscosity [° C.] |
|---|---|---|---|---|---|---|
| Prepreg A | R-1570 | #2116 | 66 | — | $2.3 \times 10^2$ | 140 |
| Prepreg B | R-1570(H) | #2116 | 66 | — | $9.4 \times 10^4$ | 130 |
| Prepreg C | R-1570 | #2116 | 55 | — | $2.3 \times 10^2$ | 140 |
| Prepreg D | R-1570(LL) | #2116 | 66 | — | $9.0 \times 10^1$ | 140 |
| Prepreg E | R-1570(HH) | #2116 | 66 | — | $3.0 \times 10^5$ | 130 |
| Sheet S | XV2226S | — | — | 100 | $1.1 \times 10^4$ | 90 |
| Sheet T | XV2008S | — | — | 100 | $6.6 \times 10^5$ | 85 |

[Embedding Property]
(Presence or Absence of Void Generation)

The resultant thick conductor built-in type printed wiring board was observed in its cross section by magnifying it by 200 times using a digital microscope ("VH-Z500" manufactured by KEYENCE CORPORATION, hereinafter, referred to as the digital microscope). A diameter of a void was measured using a measuring function of the digital microscope, and presence of absence of void generation was evaluated under the following evaluation criteria.

"OK" is a case where a void having a diameter of more than or equal to 10 μm was not observed.

"NG" is a case where the void having the diameter of more than or equal to 10 μm was observed.

(Presence or Absence of Cloth Touch Occurrence)

The resultant thick conductor built-in type printed wiring board was observed in its cross section by magnifying it by 200 times using the digital microscope. Presence of absence of cloth touch occurrence was evaluated under the following evaluation criteria.

"OK" is a case where both of contact between second fibrous base material 32 and first circuit 12 and contact between third fibrous base material 62 and second circuit 13 were not observed.

"NG" is a case where at least one of contact between second fibrous base material 32 and first circuit 12 and contact between third fibrous base material 62 and second circuit 13 was observed.

[Reflow Heat Resistance]

The resultant thick conductor built-in type printed wiring board was cut to be 5 cm square to obtain samples, and the resultant samples were subjected to a pressure cracker test (PCT) under conditions of $12_1°$ C. and two hours. Next, the samples after subjected to the PCT processing were passed through a reflow furnace set at 260° C. (maximum temperature) to obtain samples after reflow processing. Cross sections of the resultant samples after reflow processing were observed by magnifying them by 500 times using the digital microscope. Presence or absence of crack generation is evaluated by the following evaluation criteria.

"OK" is a case where crack generation was not observed.
"NG" is a case where the crack generation was observed.

Evaluation results in examples 1 to 9 and comparative examples 1 to 5 are illustrated in Tables 1 to 3 as to the above-mentioned embedding property and reflow heat resistance. In the thick conductor built-in type printed wiring boards according to examples 1 to 9, good embedding property and reflow heat resistance could be obtained. In contrast, in the thick conductor built-in type printed wiring boards according to comparative examples 2, 3 that did not use resin sheets, cloth touch was occurred to make embedding property bad, and a crack was generated to make reflow heat resistance bad. In the thick conductor built-in type printed wiring board according to comparative example 1 in which a compression start temperature is low, a void of more than or equal to 10 μm was generated to make embedding property bad, and also a crack was generated to make reflow heat resistance bad. In the thick conductor built-in type printed wiring board according to comparative example 4 using prepreg D whose minimum melt viscosity is smaller than $1 \times 10^2$ Pa·s, cloth touch was occurred to make embedding property bad, and a crack was generated to make reflow heat resistance bad. In contrast, in the thick conductor built-in type printed wiring board according to comparative example 5 using prepreg E whose minimum melt viscosity is higher than $1 \times 10^5$ Pa·s, a void of more than or equal to 10 μm was generated to make embedding property bad, and a crack was generated to make reflow heat resistance bad.

The invention claimed is:
1. A thick conductor built-in type printed wiring board comprising:
a printed wiring board that includes an insulating layer and a circuit provided on one main surface or both main surfaces of the insulating layer, the insulating layer including a cured product of a first resin composition, the circuit including a plurality of conductor wirings each having a thickness ranging from 105 μm to 630 μm, inclusive;

an insulating resin layer that covers a surface of the printed wiring board on which the circuit is provided, the insulating resin layer including a cured product of a second resin composition and no fibrous base material;

an insulating base material layer that covers the insulating resin layer, the insulating base material layer including a cured product of a third resin composition and a fibrous base material; and a conductor layer that covers the insulating base material layer, wherein:

the insulating resin layer is disposed between the circuit and the insulating base material layer, and a void having a diameter of more than or equal to 10 μm is not included inside the thick conductor built-in type printed wiring board.

2. The thick conductor built-in type printed wiring board according to claim 1, wherein a distance between the circuit and the conductor layer ranges from 20 μm to 1000 μm, inclusive.

3. The thick conductor built-in type printed wiring board according to claim 1, wherein:

the second resin composition has a minimum melt viscosity ranging from $1\times10^2$ Pa·s to $1\times10^6$ Pa·s, inclusive, the minimum melt viscosity being obtained at a first temperature ranging from 60° C. to 130° C., inclusive, and the third resin composition has a minimum melt viscosity ranging from $1\times10^2$ Pa·s to $1\times10^5$ Pa·s, inclusive, the minimum melt viscosity being obtained at a second temperature of more than or equal to the first temperature at which the minimum melt viscosity of the second resin composition is obtained and less than or equal to 170° C.

4. A method for producing a thick conductor built-in type printed wiring board, the method comprising:

step (A) of preparing a printed wiring board that has an insulating layer and a circuit provided on one main surface or both main surfaces of the insulating layer, the insulating layer including a cured product of a first resin composition, the circuit including a plurality of conductor wirings each having a thickness ranging from 105 μm to 630 μm, inclusive;

step (B) of forming a laminated body by overlapping a resin layer, a prepreg, and a conductor layer in this order on a surface of the printed wiring board on which the circuit is provided, the resin layer including an uncured product of a second resin composition and no fibrous base material, the prepreg including a fibrous base material and an uncured product of a third resin composition that is impregnated in the fibrous base material; and step (C) of integrating the laminated body by heating and compressing the laminated body disposed between hot plates, wherein in the step (B), the resin layer is disposed between the circuit and the prepreg.

5. The method for producing the thick conductor built-in type printed wiring board according to claim 4, wherein:

the second resin composition has a minimum melt viscosity ranging from $1\times10^2$ Pa·s to $1\times10^6$ Pa·s, inclusive, the minimum melt viscosity being obtained at a first temperature ranging from 60° C. to 130° C., inclusive, and the third resin composition has a minimum melt viscosity ranging from $1\times10^2$ Pa·s to $1\times10^5$ Pa·s, inclusive, the minimum melt viscosity being obtained at a second temperature of more than or equal to the first temperature at which the minimum melt viscosity of the second resin composition is obtained and less than or equal to 170° C.

6. The method for producing the thick conductor built-in type printed wiring board according to claim 5, wherein in step (C), after the hot plates are heated with the laminated body disposed between the hot plates, compression of the laminated body is started when a temperature of the hot plates becomes within a range from a temperature lower than the second temperature by 20° C. to a temperature higher than the second temperature by 20° C., the minimum melt viscosity of the third resin composition being obtained at the second temperature.

* * * * *